United States Patent [19]

Hagio et al.

[11] Patent Number: 4,665,416

[45] Date of Patent: May 12, 1987

[54] SEMICONDUCTOR DEVICE HAVING A PROTECTION BREAKDOWN DIODE ON A SEMI-INSULATIVE SUBSTRATE

[75] Inventors: Masahiro Hagio, Kyoto; Shutaro Nanbu; Kunihiko Kanazawa, both of Osaka; Shunji Ogata, Kyoto; Shiro Tohmori, Osaka, all of Japan

[73] Assignee: Matsushita Electronics Corporation, Japan

[21] Appl. No.: 908,895

[22] Filed: Sep. 18, 1986

Related U.S. Application Data

[63] Continuation of Ser. No. 644,047, Aug. 24, 1986.

[30] Foreign Application Priority Data

Aug. 25, 1983 [JP] Japan ................. 58-155867

[51] Int. Cl.4 .......................................... H01L 29/80
[52] U.S. Cl. ...................................... 357/22; 357/55; 357/20; 357/86; 357/15
[58] Field of Search ................. 357/55, 23.13, 86, 20, 357/22, 15

[56] References Cited

U.S. PATENT DOCUMENTS

| | | | |
|---|---|---|---|
| 3,275,482 | 9/1966 | Meer ................................. | 357/55 X |
| 3,617,398 | 11/1971 | Bilous et al. ..................... | 357/86 X |
| 3,644,801 | 2/1972 | Sheldon ............................ | 357/55 X |
| 3,673,428 | 6/1972 | Athanas .......................... | 357/23.13 X |
| 4,044,373 | 8/1977 | Nomiya et al. .................. | 357/86 X |
| 4,047,975 | 9/1977 | Wigmann ........................ | 357/55 X |
| 4,160,988 | 7/1979 | Russell ............................. | 357/55 X |
| 4,300,152 | 11/1981 | Lepselter ......................... | 357/15 X |
| 4,356,503 | 10/1982 | Shafer et al. .................... | 357/86 X |
| 4,486,766 | 12/1984 | Shannon .......................... | 357/15 |
| 4,498,093 | 2/1985 | Allyn et al. ..................... | 357/15 X |
| 4,513,309 | 4/1985 | Cricchi ............................ | 357/86 X |

Primary Examiner—Andrew J. James
Assistant Examiner—William A. Mintel
Attorney, Agent, or Firm—Lowe, Price, LeBlanc, Becker & Shur

[57] ABSTRACT

A semiconductive device comprising a substrate of a semi-insulative material, a first impurity-doped semiconductive region of an n-conductivity type formed in the substrate, a second impurity-doped semiconductive region of p-conductivity type formed in the substrate. The second region has a generally U-shaped cross-section, one of the vertical limbs of the U adjoining the first region to form a p-n junction therewith and the web portion of the U being located in a position deeper than the bottom of the first region. First and second conductors are deposited on the first and second regions to provide an ohmic contact therewith.

8 Claims, 4 Drawing Figures

SEMICONDUCTOR DEVICE HAVING A PROTECTION BREAKDOWN DIODE ON A SEMI-INSULATIVE SUBSTRATE

This application is a continuation of application Ser. No. 644,047 filed Aug. 24, 1984.

BACKGROUND OF THE INVENTION

The present invention relates to a semiconductive device having a breakdown diode for protection purposes.

SUMMARY OF THE INVENTION

The present invention provides a semiconductive device having a breakdown diode capable of carrying a heavy surge current for protecting the device from high voltages.

A semiconductive device according to the present invention comprises a substrate of a semi-insulative material on which impurities of different conductivity types are doped to form a first semiconductive region of a given conductivity type and a second semiconductive region of opposite conductivity type. The second region has a generally U-shaped cross-section, one of the vertical limbs of the U adjoining the first region to form a p-n junction therewith. The web portion of the U is located in a position deeper than the bottom of the first region. Metal is deposited on the first and second regions to form cathode and anode electrodes. Since the p-n junction is formed on a lateral boundary between the first and second semiconductor regions, backward-biasing of the p-n junction results in the generation of a depletion region within an area of the first region adjacent the lateral boundary when the first and second regions are backward biased. The depletion region in no way constricts the area of the p-n junction, so that a heavy current can be passed through the backward-biased diode.

The present invention further provides a Schottky-barrier gate field-effect transistor which is provided with a breakdown diode having an anode coupled to the gate of the transistor and a cathode coupled to one of the source and drain electrodes of the transistor. A surge current will see a low impedance path through the cathode-to-anode path of the diode when it is backward biased by a high voltage.

BRIEF DESCRIPTION OF THE DRAWINGS

The present invention will be described in further detail with reference to the accompanying drawings, in which.

DETAILED DESCRIPTION

Figure 1:
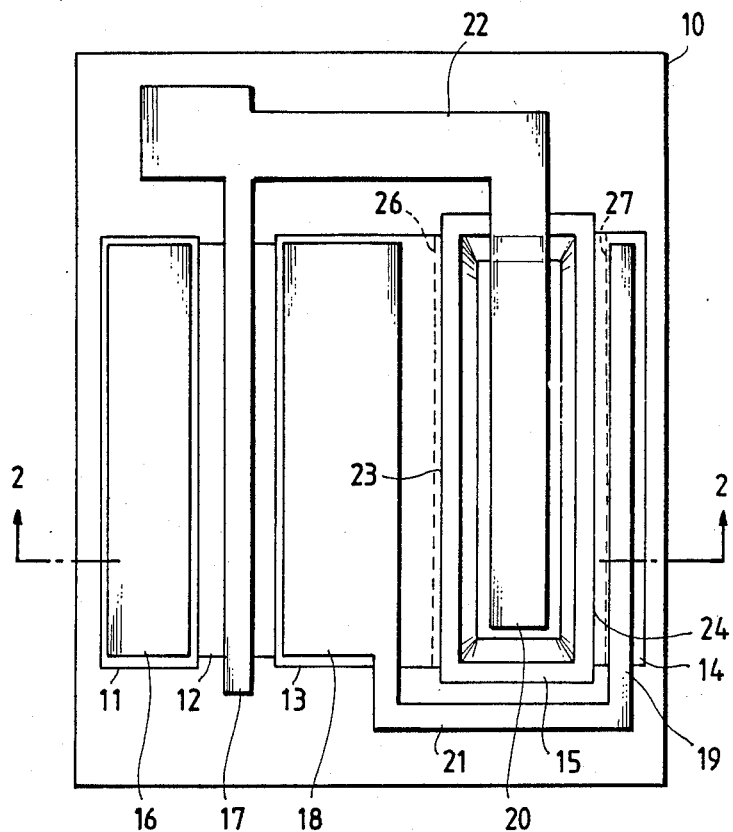
FIG. 1 is a plan view of a Schottky-barrier gate field-effect transistor according to an embodiment of the invention.
Figure 2:
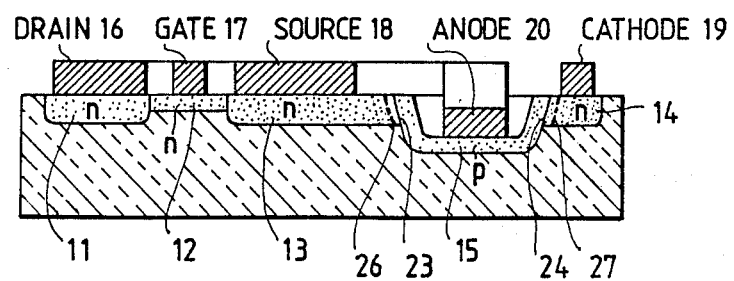
FIG. 2 is a cross-sectional view taken along the lines 2—2 of FIG. 1.

There is shown in FIGS. 1 and 2 a GaAs Schottky-barrier gate field-effect transistor for UHF applications, or known as GaAs metal semiconductor field-effect transistor (MESFET) constructed according to one embodiment of the present invention. Illustrated at 10 is a GaAs semi-insulative substrate on which n-type impurity-doped semiconductor regions 11, 12, 13 and 14 are formed by a known ion implantation technique. The n-type conductivity regions 13 and 14 have a thickness of 0.3 micrometers and the region 12, located between regions 11 and 13, has a thickness of 0.2 micrometers. A portion of substrate 10 between n-type regions 13 and 14 is etched away to a depth of 0.4 micrometers to create a recess generally in the form of a rectangular, shallow basin. P-type impurities are diffused over the recess until a thickness of 0.1 micrometers is attained using diffusion or ion implantation technique to create a p-type impurity-doped semiconductor region 15, forming p-n junctions 23 and 24 with adjacent n-type semiconductor regions 13 and 14. An alloy of gold and germanium is vacuum evaporated through an appropriate mask on the n-type regions 11, 13 and 14 to form a drain electrode 16, a source electrode 18 and a cathode 19 in ohmic contact with regions 11, 13 and 14, respectively. Chromium, platinum and gold are vacuum evaporated on n-type region 12 and p-type region 15 to form a Schottky-barrier gate 17 of a multilayered structure on n-type region 12 and an anode 20 in ohmic contact with p-type region 15. During these evaporation processes conductive strips 21 and 22 are formed on the substrate to couple the source 18 to cathode 19 and couple the gate 17 to anode 20.

Figure 3:
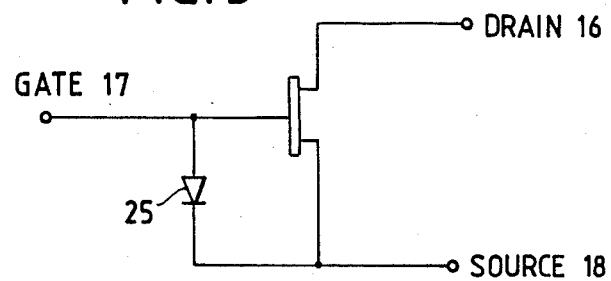
FIG. 3 is a circuit diagram of the field-effect transistor with a breakdown diode connected between its gate and source electrodes.

A Schottky-barrier gate field-effect transistor is thus formed by the drain 16, gate 17 and source 18 and a breakdown diode is formed by cathode 19 and anode 20 in an integrated structure on a common substrate. This breakdown diode is connected as shown at 25 in FIG. 3. If diode 25 is backward biased by electrostatic charges, a surge current which would otherwise pass through the source to gate electrodes of the transistor, will see a low impedance path through diode 25.

The p-type region 15 could be formed within an n-type semiconductor region. However, a depletion region, which is generated in the n-type region when the breakdown diode is backward biased, tends to drift to the underlying substrate and as a result the p-n junction area is substantially reduced and restricts its current carrying capacity.

In the illustrated embodiment, depletion regions are confined within boundaries shown at 26 and 27 in the laterally disposed n-type regions and no depletion region occurs that imposes limitations on the current carrying capacity of the breakdown diode.

It is also found that the generally U-shaped cross-section of p-type region 15 eliminates undesirable diffusion of impurities in lateral directions which might otherwise occur if the p-type region is formed without creating the recess and diffusing the impurities through the surface of the substrate to a depth greater than the adjacent n-type region.

In a practical embodiment, n-type regions 13 and 14 are preferably formed in a single layer and an intermediate portion is etched down through and partially into the underlying substrate to form a recess on which p-type impurities are diffused. In the present invention, the depth of n-type regions 13, 14 is defined as a value attained when the carrier concentration in profile is one half of the maximum concentration value. The substantial area of p-type region 15 is thus preferably located at a depth at which the adjacent n-type regions have one-half of their maximum carrier concentration. For purposes of enhancing the tendency of the depletion regions to localize in n-type regions 13, 14 while reducing their tendency to occur within the portion of p-type region 15 contacting the substrate, p-type region 15 has preferably a carrier concentration which is much higher than the carrier concentration of the adjacent n-type regions.

Figure 4:
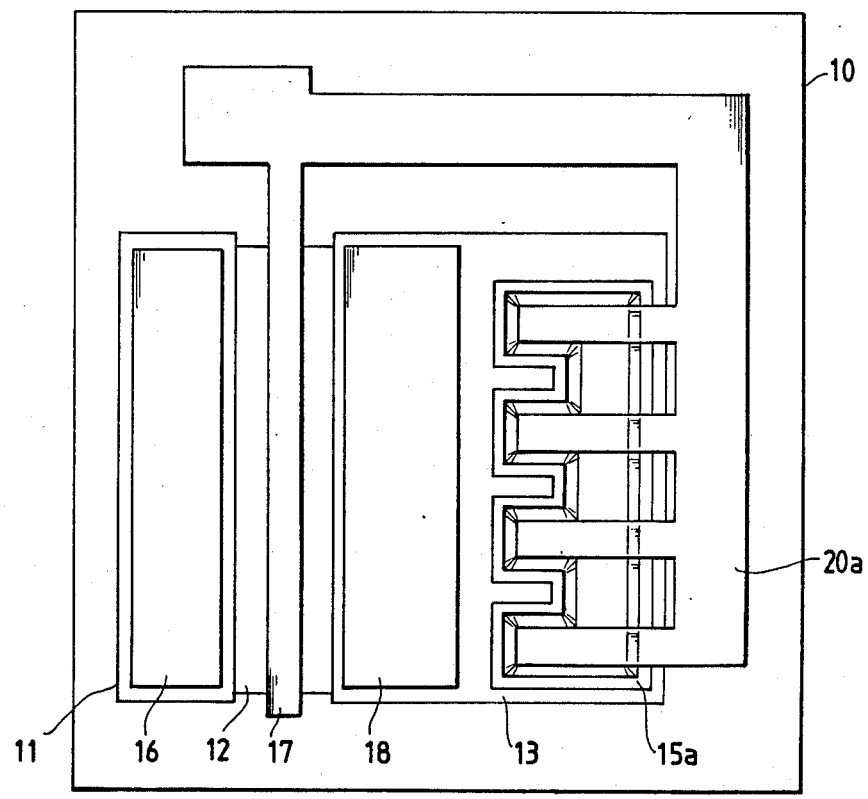
FIG. 4 is a plan view of a second embodiment of the GaAs field-effect transistor.

Since the current carrying capacity of the breakdown diode 25 depends on the area of its p-n junctions, an embodiment shown in FIG. 4 is suitable for this purpose. In this embodiment, p-type region 15a is formed by creating a recess of a comb-like configuration within n-type region 13 to a depth greater than the depth of the surrounding n-type region and diffusing p-type impurities over the recess. Multilayered conductive structure of a comb-like configuration 20a is formed on the recess simultaneously with the deposition of Schottky-barrier gate 17. In this embodiment, source electrode 18 also serves as the cathode of the breakdown diode.

It will be seen therefore that the breakdown diode as taught by the present invention could be fabricated independently of the field-effect transistor and used as an independent semiconductive device that provides excellent performance under backward biased conditions.

The foregoing description shows only preferred embodiments of the present invention. Various modifications are apparent to those skilled in the art without departing from the scope of the present invention which is only limited by the appended claims. For example, semi-insulative substrates such as InP could equally be used in place of GaAs. The breakdown diode may be provided between the gate and drain of the transistor instead of being connected between the gate and source.

What is claimed is:

1. A semiconductor device comprising:
   a substrate of a semi-insulative material having a recess formed in an upper surface thereof, said recess having side walls and a bottom wall;
   a first impurity-doped semiconductive region of a given conductivity type formed in an upper portion of said substrate surface adjacent and unoccupied by said recess and defining a first boundary in said substrate at the lower edge of said first region;
   a second, impurity-diffused semiconductive region of a conductivity type opposite to said given conductivity type and formed in the portion of said substrate surrounding the side and bottom walls of said recess, said second region having vertically extending portions parallel with the side walls of said recess connected with a horizontally extending portion parallel with the bottom wall of said recess, one of said vertically extending portions of said second region adjoining said first region to form a p-n junction therewith and the lower edge of the horizontally extending portion of said second region defining a second boundary in said substrate at a depth greater than said first boundary;
   a first electrode on said first semiconductive region; and
   a second electrode on said second semiconductive region.

2. A semiconductor device as claimed in claim 1, wherein said second region has a carrier concentration higher than the carrier concentration of said first impurity-doped region.

3. A semiconductor device as claimed in claim 1, further comprising a third semiconductive region of the given conductivity type formed in said substrate surface and adjoining another of said vertically extending portions of the second region to form a second p-n junction therewith, the lower edge of said third region defining a third boundary in said substrate at a depth less than said second boundary, and a third electrode on said third region, said third electrode being connected to said first electrode.

4. A semiconductor device as claimed in claim 1, wherein said second region is in the shape of a comb.

5. A semiconductor device as claimed in claim 3, further comprising:
   a fourth semiconductive region of said given conductivity type formed in said substrate surface remote from said first, second and third regions;
   a fifth semiconductive region located between and adjacent said first and fourth semiconductive regions;
   a fourth electrode on said fourth semiconductive region; and
   a fifth electrode on said fifth semiconductive region and connected to said second electrode.

6. A semiconductor device comprising:
   a substrate of a semi-insulative material having a recess formed in an upper surface thereof, said recess having side walls and a bottom wall;
   a first impurity-doped semiconductive region of a given conductivity type formed in said substrate surface adjacent said recess and defining a first boundary in said substrate at the lower edge of said first region;
   a second impurity-doped semiconductive region of said given conductivity type formed in said substrate surface remote from said recess and said first region and defining a second boundary in said substrate at the lower edge of said second region at a depth equal to the depth of said first boundary;
   a third semiconductive region of said given conductivity type formed in said substrate surface and located between and adjacent said first and second semiconductive regions and defining a third boundary in said substrate at the lower edge of said third region at a depth less than the depth of said first and second semiconductive boundaries;
   a fourth, impurity-diffused semiconductive region of a conductivity type opposite to said given conductivity type and formed in the portion of said substrate surrounding the side walls and bottom wall of said recess, said fourth semiconductive region having vertically extending portions parallel with said side walls of said recess connected with a horizontally extending portion parallel with the bottom wall of said recess, one of said vertically extending portions adjoining said first semiconductive region to form a first p-n junction therewith, the lower edge of the horizontally extending portion of said fourth semiconductive region defining a fourth boundary in said substrate at a depth greater than the depth of said first and second boundaries;
   a fifth semiconductive region of said given conductivity type formed in said substrate surface adjoining said fourth semiconductive region to define a second p-n junction therewith, the lower edge of said fifth region defining a fifth boundary in said substrate at a depth less than said fourth boundary;
   first and second electrodes in ohmic contact with said first and second semiconductor regions, respectively;

a third electrode in Schottky-barrier contact with said third semiconductive region;

a fourth electrode in ohmic contact with said fourth semiconductive region, the fourth electrode being connected to said third electrode; and a fifth electrode in ohmic contact with said fifth semiconductive region, said fifth electrode being connected to said first electrode.

7. A semiconductor device as claimed in claim 6, wherein said fourth semiconductive region has a carrier concentration higher than the carrier concentration of said first and second semiconductive regions.

8. A semiconductor device as claimed in claim 6 wherein said fourth semiconductive region is in the shape of a comb.

* * * * *